United States Patent
Wang et al.

(10) Patent No.: US 11,158,777 B2
(45) Date of Patent: Oct. 26, 2021

(54) LED LIGHT SOURCE

(71) Applicant: Lumileds LLC, San Jose, CA (US)

(72) Inventors: Zhaoxin Wang, Shanghai (CN); Dusan Golubovic, San Jose, CA (US); Shen Cheng, Shanghai (CN); Jasmine Li, Farmington Hills, MI (US); Min Cui, Shanghai (CN)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/661,821

(22) Filed: Oct. 23, 2019

(65) Prior Publication Data

US 2020/0136001 A1    Apr. 30, 2020

(30) Foreign Application Priority Data

Oct. 26, 2018  (WO) ............... PCT/CN2018/112076
Dec. 4, 2018   (EP) .................................... 18210089

(51) Int. Cl.
| H01L 33/64 | (2010.01) |
| H01L 33/62 | (2010.01) |
| F21V 29/70 | (2015.01) |
| H01L 33/56 | (2010.01) |
| F21Y 115/10 | (2016.01) |

(52) U.S. Cl.
CPC ............ H01L 33/644 (2013.01); F21V 29/70 (2015.01); H01L 33/56 (2013.01); H01L 33/62 (2013.01); *F21Y 2115/10* (2016.08)

(58) Field of Classification Search
CPC ....... H01L 33/644; H01L 33/62; H01L 33/56; H01L 33/642; H01L 25/167; F21V 29/70; F21V 29/89; F21V 29/87; F21V 23/009; F21Y 2115/10
See application file for complete search history.

(56) References Cited

U.S. PATENT DOCUMENTS

| 2009/0189169 A1* | 7/2009 | Wei ....................... F21V 23/006 257/98 |
| 2011/0140157 A1* | 6/2011 | Chang ..................... F21V 29/70 257/98 |
| 2012/0170262 A1* | 7/2012 | Hoetzl .................. F21V 29/507 362/227 |

FOREIGN PATENT DOCUMENTS

| WO | 2011/123984 A1 | 10/2011 |
| WO | 2011123984 A1  | 10/2011 |

OTHER PUBLICATIONS

Extended European Search Report dated May 22, 2019, European Patent Application No. 18210089.1, 7 pages.
(Continued)

*Primary Examiner* — Edward Chin

(57) ABSTRACT

An LED light source is described herein, which comprises: a hollow heat sink having a top wall, a bottom opening, and a sidewall, the top wall including an upper surface and a lower surface, the upper surface having a central area and a peripheral area, and the top wall having at least one first hole in the peripheral area; an interposer being overmolded on the peripheral area and the lower surface, and extending through the at least one first hole; an LED package comprising at least one LED chip and mounted in the central area; an LED driver located within the hollow heat sink and positioned on a side of the interposer facing the bottom opening.

20 Claims, 4 Drawing Sheets

(56) References Cited

OTHER PUBLICATIONS

From the EPO as the ISA, "Notification of Transmittal of the International Search Report and the Written Opinion of the International Searching Authority, or the Declaration", corresponding to PCT/EP2019/078334, dated Jan. 15, 2020, 12 pages.

* cited by examiner

LED LIGHT SOURCE

CROSS REFERENCE TO RELATED APPLICATIONS

This application claims priority to International Patent Application No. PCT/CN2018/112076 filed on Oct. 26, 2018 titled "LED LIGHT SOURCE," and claims priority to European Patent Application No. 18210089.1 filed on Dec. 4, 2018 titled "LED LIGHT SOURCE." International Patent Application No. PCT/CN2018/112076 and European Patent Application No. 18210089.1 is incorporated herein by reference.

TECHNICAL FIELD

This disclosure relates to a technical field of lighting, and specifically to an LED light source.

BACKGROUND

Nowadays, LED based light emitting devices have been widely used in various lighting applications, such as general lighting or automotive lighting. Typically, an LED light source includes an LED package, a driver to provide driving current to the LED package, and a heat sink for heat dissipation.

In many scenarios, high-density light output is required, so a heat sink with good performance is needed. Ceramics have good heat dissipation and can be used as heat sinks for LED light sources. However, the use of ceramics will greatly increase the production cost of LED light sources.

US20120170262A1 discloses a lighting device where a hollow heat sink, within its interior, accommodates, enclosed in a housing, driving electronics for LEDs, and, on its top surface, mounts a carrier substrate with the LEDs.

SUMMARY

A general object of the present disclosure is to provide an LED light source which could overcome the above-mentioned and other possible drawbacks.

According to the present disclosure, there is provided an LED light source, comprising: a hollow heat sink, an interposer, an LED package, and an LED driver. The hollow heat sink has a top wall, a bottom opening, and a sidewall between the top wall and the bottom opening. The top wall includes an upper surface facing away from the bottom opening and a lower surface facing the bottom opening, wherein the upper surface has a central area and a peripheral area surrounding the central area and the top wall has at least one first hole in the peripheral area of the upper surface. The interposer can be made of thermally conductive and electrically insulating material, the interposer being overmolded on the peripheral area of the upper surface and the lower surface of the top wall, and extending through the at least one first hole. The LED package comprises at least one LED chip and can be mounted in the central area of the upper surface of the top wall. The LED driver is located within the hollow heat sink and positioned on a side of the interposer facing the bottom opening to be electrically insulated from the hollow heat sink, and configured to provide driving current to the at least one LED chip.

This is advantageous in that high-density light output of the LED light source can be achieved, while the production cost of the LED light source can be greatly reduced due to a relatively light hollow heatsink, while offering substantial heat dissipation capacity by its large surface area to the surrounding environment.

In an embodiment, the LED light source can further comprise a rear case located within the hollow heat sink and arranged to support the LED driver between the rear case and the interposer. Via the rear case, heat generated by the LED driver can be transferred to the sidewall of the heat sink.

In an embodiment, the LED package can comprise: a leadframe on which the at least one LED chip is arranged; and a transparent encapsulation material with which the at least one LED chip and part of the leadframe are overmolded. In this case, the at least one LED chip within the LED package can be protected. Further, the transparent encapsulation material can be shaped on a side of the leadframe where the at least one LED chip is located to shape the light output of the at least one LED chip. As an example, the leadframe can be made of silver-plated copper, and the transparent encapsulation material can comprise transparent epoxy or silicone.

In an embodiment, the leadframe can comprise at least one second hole that is not overmolded with the transparent encapsulation material. Through the at least one second hole, connecting wires electrically connect the LED driver to the at least one LED chip.

In an embodiment, the top wall can protrude from the upper surface at the central area of the upper surface to support the LED package. Such a design can also facilitate the mounting of the LED package in the central area.

In an embodiment, a material of the heat sink can comprise metal, such as aluminum or copper. In this case, the cost of the heat sink can be greatly reduced while offering large heat dissipation to the environment by the good heat conduction and heat radiation transfer properties of these materials.

In an embodiment, the sidewall has a thickness of 1-1.5 mm, which could achieve a good balance of weight and heat dissipation of the heat sink.

In an embodiment, the hollow heat sink has a hollow cylindrical shape. As an example, the bottom opening has a diameter of 20-30 mm, which facilitates the production of a light source suitable for automotive lighting.

In an embodiment, the interposer can be made of thermally conductive and electrically insulating material, such as resin, plastic, nylon, or the like. The interposer overmolded through the at least one first hole can create a strong connection, thereby achieving long lifetime of the interposer and thus the light source. Further, the interposer can be shaped to fit interfaces of the various lamp housings.

In an embodiment, the LED driver can be in the form of a printed circuit board. Heat generated by the LED driver can be transferred to the sidewall of the hollow heat sink via the LED driver's contact to the interposer while being electrically insulated from the heat sink.

These and other advantages of the disclosure will be apparent from and elucidated with reference to the embodiments described hereinafter.

BRIEF DESCRIPTION OF THE DRAWINGS

The disclosure will now be described in more detail and with reference to the appended drawings in which.

DETAILED DESCRIPTION

The present disclosure will now be described more fully with reference to the accompanying drawings, in which currently preferred embodiments of the disclosure are shown. The disclosure may, however, be embodied in many different forms and should not be construed as limited to the embodiments set forth herein; rather, these embodiments are provided for thoroughness and completeness, and fully convey the scope of the invention to the person skilled in the art. Like reference numbers refer to like elements throughout. It is also intended that the terminology used in this disclosure be interpreted in its broadest reasonable manner, even though it is being used in conjunction with a detailed description of certain embodiments of the disclosure.

Figure 1:
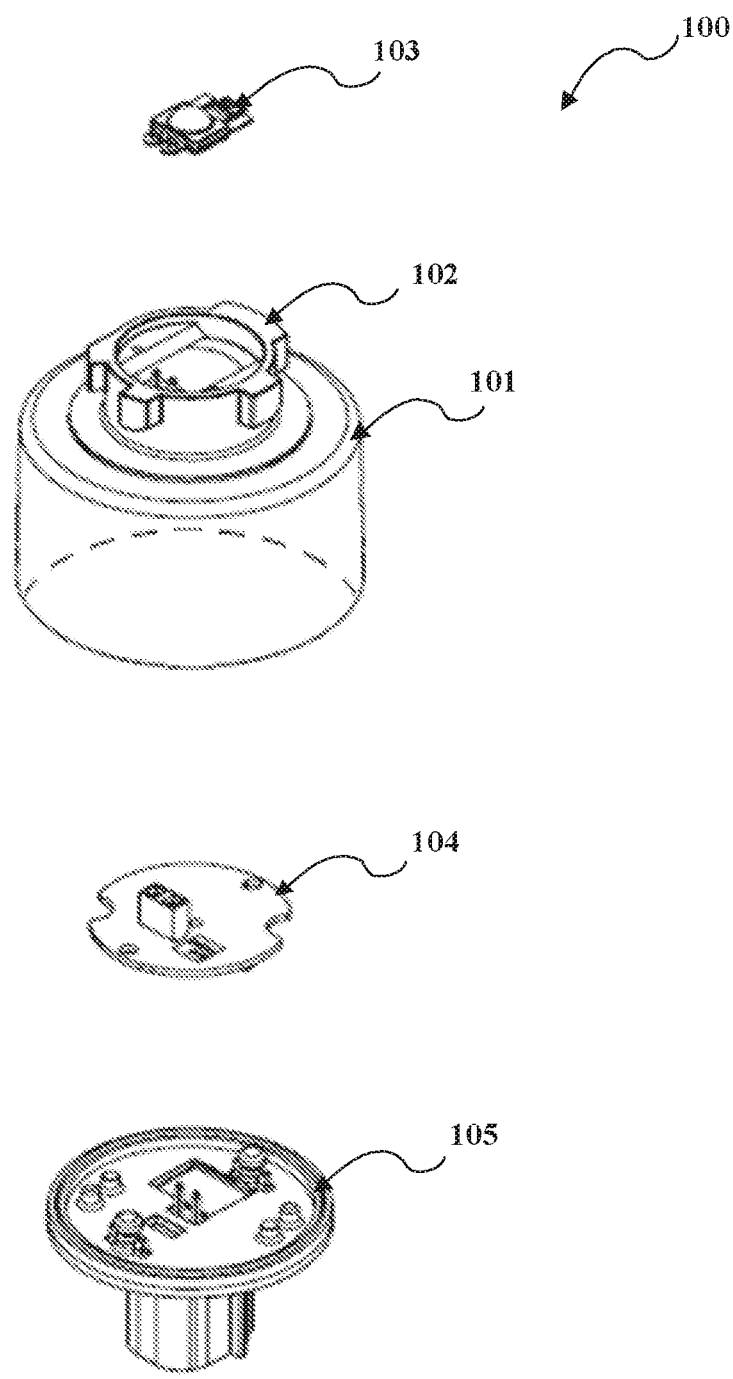
FIG. 1 is an exploded view of an LED light source according to an embodiment of the disclosure.

FIG. 1 is an exploded view of an LED light source 100 according to an embodiment of the disclosure. As shown, the LED light source 100 can comprise a hollow heat sink 101, an interposer 102, an LED package 103, and an LED driver 104, which will be described in detail below in conjunction with FIGS. 2 and 3. In an embodiment, the LED light source 100 can further comprise a rear case 105.

Figure 2:
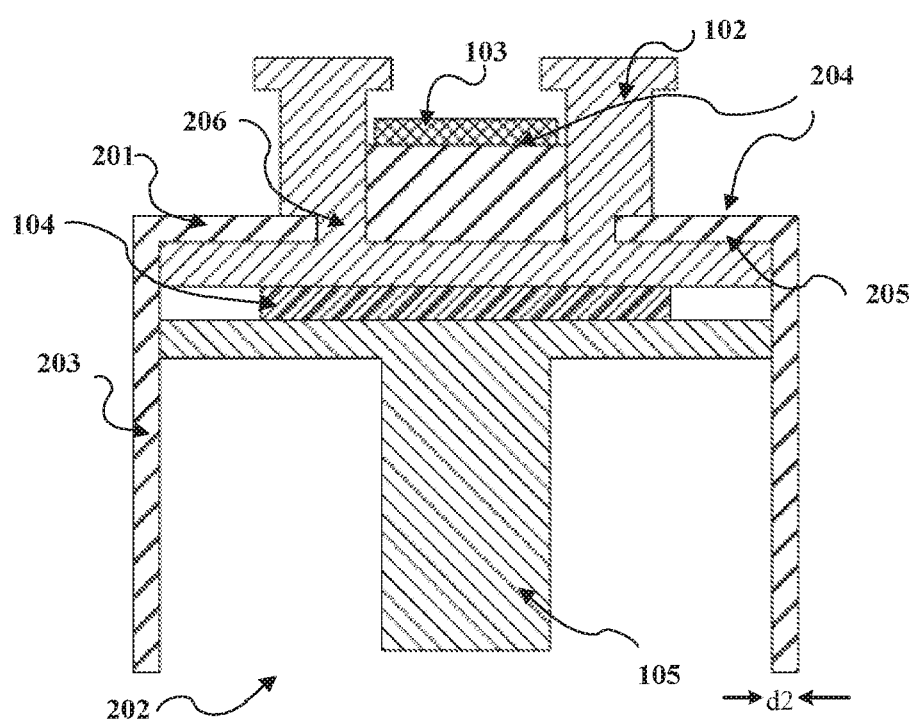
FIG. 2 is a cross-sectional view of the LED light source according to an embodiment of the disclosure.
Figure 3:
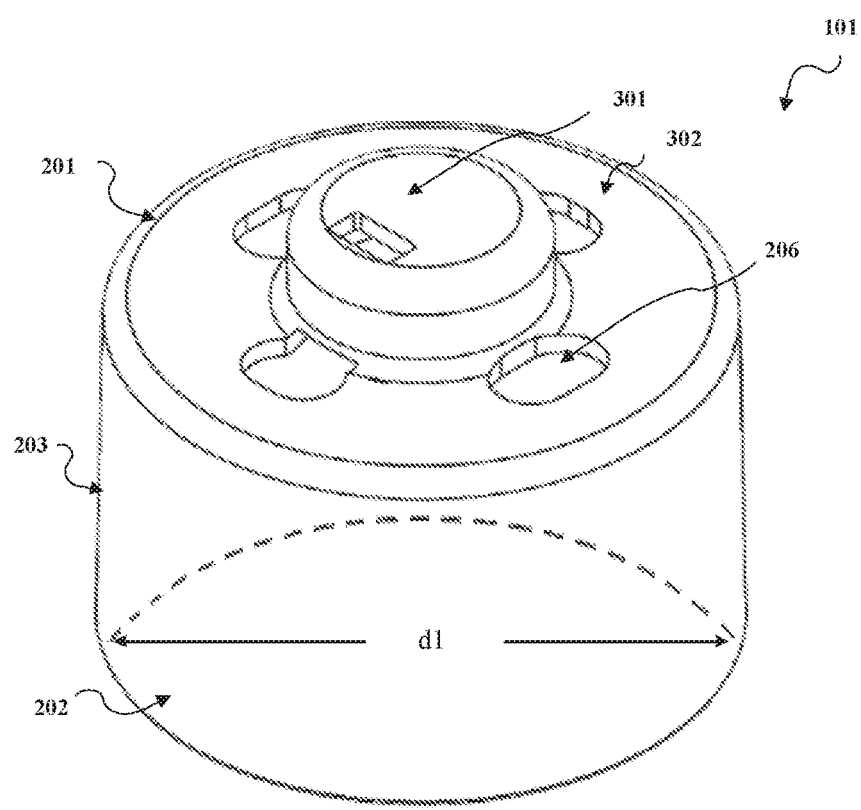
FIG. 3 is a schematic view of an hollow heat sink used in the LED light source according to an embodiment of the disclosure.

FIG. 2 is a cross-sectional view of the LED light source 100 according to an embodiment of the disclosure, and FIG. 3 is a schematic view of a hollow heat sink 101 usable in an embodiment of the disclosure. As shown in FIG. 3, the hollow heat sink 101 has a top wall 201, a bottom opening 202, and a sidewall 203 between the top wall 201 and the bottom opening 202. Referring to FIG. 2, the top wall 201 includes an upper surface 204 facing away from the bottom opening 202 and a lower surface 205 facing the bottom opening 202. The upper surface 204 having a central area 301 and a peripheral area 302 surrounding the central area 301, as shown in FIG. 3. Further, the top wall 201 can comprise at least one first hole 206 in the peripheral area 302 of the upper surface 204.

In an embodiment, the heat sink 101 can be made of thermally conductive material, which is not limited herein. As an example, the material of the heat sink 101 can comprise a cheap metal, such as aluminum or copper. In this case, the cost of the heat sink can be greatly reduced.

In an embodiment, the hollow heat sink 101 can have a hollow cylindrical shape, which is of course not limited herein. In this case, the bottom opening 202 can, for example, have a diameter d1 of 20-30 mm, which facilitates the production of a light source suitable for automotive lighting.

As an example, the sidewall 203 of the heat sink 101 can have a thickness d2 of 1-1.5 mm, which could achieve a good balance of weight and heat dissipation of the heat sink 101.

The interposer 102 is overmolded on the peripheral area 302 of the upper surface 204 and the lower surface 205 of the top wall, and extends through the at least one first hole 206, as shown in FIGS. 1 and 2. The interposer 102 can be made of thermally conductive and electrically insulating material, such as resin, plastic, nylon, or the like. The interposer 102 overmolded through the at least one first hole 206 can create a strong connection, thereby achieving long lifetime of the interposer and thus the light source. In an embodiment, the interposer 102 can be shaped to fit interfaces of the various lamp housings.

The LED package 103 comprises at least one LED chip, and can be mounted in the central area 301 of the upper surface 204 of the top wall 201, as shown in FIG. 2. As an example, the LED package 103 can be mounted in the central area 301 by means of thermally conductive adhesive, but which is not limited herein. In an embodiment, the top wall 201 protrudes from the upper surface 204 at the central area 301 of the upper surface 204 to support the LED package 103, which facilitates the mounting of the LED package 103 in the central area 301.

In this case, heat generated by the at least one LED chip can be transferred to the hollow heat sink 101, whose function is to dissipate heat to its environment through the sidewall 203 mainly.

The LED driver 104 is located within the hollow heat sink 101 and positioned on a side of the interposer 102 facing the bottom opening 202 to be electrically insulated from the hollow heat sink 101. By such construction, the hollow heat sink 101 can provide protection to the LED driver 104. The LED driver 104 is configured to provide driving current to the at least one LED chip, so as to drive the at least one LED chip to emit light. As an example, the LED driver 104 can be connected to a power supply and can be in the form of a PCB (printed circuit board).

It should be noted that the LED driver 104 can be positioned on the side of the interposer 102 facing the bottom opening 202 in any manner. For example, the LED driver 104 can be fixed on the side of the interposer 102 facing the bottom opening 202 by thermally conductive adhesive. The LED driver 104 also generates heat, which can be transferred to the sidewall 203 of the hollow heat sink 101 via the LED driver's contact to the interposer 102.

In an embodiment, the LED light source 100 can further comprise a rear case 105. The rear case 105 can be located within the hollow heat sink 101 and arranged to support the LED driver 104 between the rear case 105 and the interposer 102. The rear case 105 can also be made of thermally conductive and electrically insulating material, such as resin, plastic, nylon, or the like. The rear case 105 can be arranged in any manner to support the LED driver 104 between the rear case 105 and the interposer 102. For example, the rear case 105 can be fixed to the interposer 102 by screws or glue to support the LED driver 104. It should be noted that the heat generated by the LED driver 104 can also be transferred to the sidewall 203 via the rear case 105.

Figure 4:
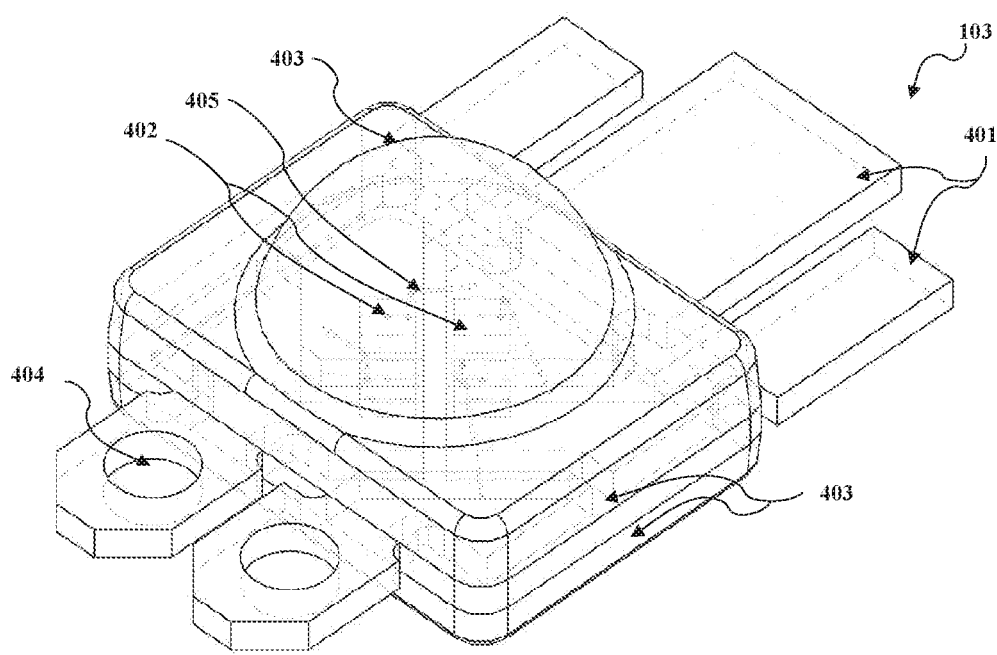
FIG. 4 is a perspective view of an LED package usable within an embodiment of the disclosure.

FIG. 4 is a perspective view of an LED package 103 usable within an embodiment of the disclosure. As shown, the LED package 103 can comprise: a leadframe 401 on which at least one LED chip 402 is arranged; and a transparent encapsulation material 403 with which the at least one LED chip 402 and part of the leadframe 401 are overmolded.

The leadframe 401 can comprise at least one second hole 404 which is not overmolded with the transparent encapsulation material 403, as shown in FIG. 4. As an example, the leadframe 401 can be made of silver-plated copper, but which is not limited herein. The at least one LED chip 402 can be electrically attached to the leadframe 401 via a bonding wire 405, such as a silver wire, a bronze wire, an iron wire, a golden wire, or the like.

The at least one LED chip 402 can be a mono-color LED chip or a white LED made from a blue LED chip plus phosphor. Connecting wires can be used to electrically connect the LED driver 104 to the at least one LED chip 402 though the at least one second hole 404. The connecting wires can comprise connection pins, for example. It should be noted that an arrangement of different types of LED chips is also contemplated.

In an embodiment, the transparent encapsulation material 403 can comprise transparent epoxy or silicone, whose function is to protect the at least one LED chip 402 within it. In an embodiment, the transparent encapsulation material 403 can be shaped on a side of the leadframe 401 where the at least one LED chip 402 is located to shape the light output of the at least one LED chip 402. For example, the transparent encapsulation material 403 can be shaped into a dome, as shown in FIGS. 1 and 4.

It should be noted that although the present disclosure has been described in connection with some embodiments, it is not intended to be limited to the specific form set forth herein. Rather, the scope of the present disclosure is limited only by the accompanying claims. Additionally, although individual features may be included in different claims, these may possibly be advantageously combined, and the inclusion in different claims does not imply that a combination of features is not feasible and/or advantageous. In addition, in the claims, the word "comprise" or "include" does not exclude other elements, and the indefinite article "a" or "an" does not exclude a plurality. Reference signs in the claims are provided merely as a clarifying example and shall not be construed as limiting the scope of the claims in any way.

LIST OF REFERENCE SIGNS

100 LED light source
101 hollow heat sink
102 interposer
103 LED package
104 LED driver
105 rear case
201 top wall
202 bottom opening
203 sidewall
204 upper surface
205 lower surface
206 first hole
301 central area
302 peripheral area
401 leadframe
402 LED chip
403 transparent encapsulation material
404 second hole
405 bonding wire
d1 diameter
d2 thickness

The invention claimed is:

1. An LED light source, comprising:
   a hollow heat sink having a top wall, a bottom opening, and a sidewall between the top wall and the bottom opening, the top wall including an upper surface facing away from the bottom opening and a lower surface facing the bottom opening, the upper surface having a central area and a peripheral area surrounding the central area, and the top wall having at least one first hole in the peripheral area of the upper surface;
   an interposer made of thermally conductive and electrically insulating material, the interposer being overmolded on the peripheral area of the upper surface and the lower surface of the top wall, and extending through the at least one first hole;
   an LED package comprising at least one LED chip and mounted in the central area of the upper surface of the top wall; and
   an LED driver located within the hollow heat sink and positioned on a side of the interposer facing the bottom opening to be electrically insulated from the hollow heat sink, and configured to provide driving current to the at least one LED chip, the interposer forming a thermal conduction path between the LED driver and the top wall of the heat sink.

2. The LED light source of claim 1, further comprising a rear case located within the hollow heat sink and arranged to support the LED driver between the rear case and the interposer.

3. The LED light source of claim 1, wherein the LED package further comprises:
   a leadframe on which the at least one LED chip is arranged; and
   a transparent encapsulation material with which the at least one LED chip and part of the leadframe are overmolded.

4. The LED light source of claim 3, wherein the transparent encapsulation material comprises transparent epoxy or silicone.

5. The LED light source of claim 3, wherein the leadframe comprises at least one second hole that is not overmolded with the transparent encapsulation material, through which connecting wires electrically connect the LED driver to the at least one LED chip.

6. The LED light source of claim 3, wherein the leadframe is made of silver-plated copper.

7. The LED light source of claim 3, wherein the transparent encapsulation material is shaped on a side of the leadframe where the at least one LED chip is located to shape the light output of the at least one LED chip.

8. The LED light source of claim 1, wherein the central area of the upper surface of the top wall is raised above the peripheral area of the upper surface.

9. The LED light source of claim 1, wherein the LED driver comprises a printed circuit board.

10. The LED light source of claim 1, wherein the material of the interposer comprises resin, plastic, or nylon.

11. The LED light source of claim 1, wherein a material of the heat sink comprises aluminum or copper.

12. The LED light source of claim 1, wherein the hollow heat sink has a hollow cylindrical shape.

13. The LED light source of claim 12, wherein the bottom opening has a diameter of 20-30 mm.

14. The LED light source of claim 1, wherein the sidewall has a thickness of 1-1.5 mm.

15. The LED light source of claim 1, wherein the top wall has at least one additional first hole therethrough in the peripheral area of the upper surface, and the interposer extends through the at least one additional first hole.

16. The LED light source of claim 1, wherein (i) a portion of the interposer overmolded on the upper surface of the top wall extends laterally beyond a lateral extent of the LED package, or (ii) a portion of the interposer overmolded on the lower surface of the top wall extends laterally beyond the lateral extent of the LED package.

17. The LED light source of claim 16, wherein a portion of the interposer overmolded on the lower surface of the top wall is in direct contact with the lower surface over an area that extends laterally beyond the lateral extent of the LED package.

18. The LED light source of claim 2, wherein the LED driver is enclosed within a volume defined by the interposer, the rear case, and at least a portion of the sidewall, the rear case forming a thermal conduction path between the LED driver and the side wall of the heat sink.

19. The LED light source of claim 8, wherein the central, raised area of the upper surface protrudes into a surrounding portion of the interposer.

20. A method for making an LED light source, the method comprising:

forming from thermally conductive and electrically insulating material an interposer, the interposer being overmolded on a corresponding peripheral area of an upper surface and a lower surface of a top wall of a hollow heat sink and extending through at least one first hole in the peripheral area of the upper surface of the top wall, the hollow heat sink further including a bottom opening and a sidewall between the top wall and the bottom opening, the upper surface of the top wall facing away from the bottom opening and the lower surface of the top wall facing the bottom opening, the upper surface having a central area with the peripheral area surrounding the central area;

mounting on the central area of the upper surface of the top wall an LED package comprising at least one LED chip; and positioning on a side of the interposer facing the bottom opening an LED driver, the LED driver being (i) located within the hollow heat sink, the interposer forming a thermal conduction path between the LED driver and the top wall of the heat sink, (ii) electrically insulated from the hollow heat sink, and (iii) configured to provide driving current to the at least one LED chip.

* * * * *